United States Patent [19]
Okamoto

[11] Patent Number: 5,982,312
[45] Date of Patent: Nov. 9, 1999

[54] A/D CONVERTER CIRCUIT CAPABLE OF COMPENSATING A/D-CONVERTED DIGITAL SIGNALS

[75] Inventor: Tomonori Okamoto, Kumamoto, Japan

[73] Assignee: NEC Corporation, Tokyo, Japan

[21] Appl. No.: 09/158,154

[22] Filed: Sep. 22, 1998

[30] Foreign Application Priority Data

Sep. 22, 1997 [JP] Japan .................................. 9-256992

[51] Int. Cl.[6] .................................................. H03M 1/10
[52] U.S. Cl. ........................................... 341/120; 341/118
[58] Field of Search .................................. 341/118, 115, 341/120

[56] References Cited

U.S. PATENT DOCUMENTS

| 4,831,382 | 5/1989 | Debus | 341/118 |
|---|---|---|---|
| 4,903,023 | 2/1990 | Evan | 341/118 |
| 4,973,974 | 11/1990 | Suzuki | 341/118 |
| 5,101,205 | 3/1992 | Yasuda | 341/118 |

*Primary Examiner*—Michael Tokar
*Assistant Examiner*—Anh Tran
*Attorney, Agent, or Firm*—Young & Thompson

[57] ABSTRACT

An analog-to-digital converter circuit includes an analog-to-digital converter, a memory connected to the analog-to-digital converter for receiving at least a part of the digital signals from the analog-to-digital converter to designate at least an address in accordance with the at least part of the digital signals, so that the memory is operated both to store compensating code data at the designated address in a compensation code capturing mode and to read out the compensating code data in an analog-to-digital conversion real operation mode. A control circuit is also included which is connected to the memory for controlling operation of the memory to switch between the compensation code capturing mode and the analog-to-digital conversion real operation mode.

1 Claim, 2 Drawing Sheets

5,982,312

A/D CONVERTER CIRCUIT CAPABLE OF COMPENSATING A/D-CONVERTED DIGITAL SIGNALS

BACKGROUND OF THE INVENTION

The present invention relates to an A/D converter circuit capable of compensating A/D-converted values.

A conventional A/D converter circuit is disclosed in Japanese Laid-open Patent Publication No. 7-27364. The conventional A/D converter circuit is designed to cancel an off-set voltage generated by the conventional A/ID converter circuit. This conventional A/D converter circuit will be described with reference to FIG. 1. The conventional A/D converter circuit comprises an A/D converter 1 for converting analog input signals 11 into digital output signals 12, an off-set compensating register 8 for receiving the digital output signals 12 from the A/D converter 1 to output an off-set compensating code 25 in accordance with a control signal 24, and a subtracter 2 for receiving both the digital output signals 12 from the A/D converter 1 and the off-set compensating code 25 from the off-set compensating register 8 so as to compensate the digital output signals 12 with the off-set compensating code 25, thereby outputting digital output signals 26 with compensated off-set voltages.

For starting operations of the above A/D converter circuit, an offset compensating code for the off-established compensating register 8 is set in the A/D converter 1. The analog input signal 11 corresponding to "0" level is inputted into the A/D converter 1. In response to the input of the analog input signal 11 corresponding to "0" level, a digital output signal 12 is outputted from the A/D converter 1 and then transmitted into the off-set compensating register 8, before the digital output signal 12 is held in the off-set compensating register 8. The digital output signal 12 output in response to the input of the analog input signal 11 corresponding to "0" level is just a digital value corresponding to the off-set voltage generated by the A/I) converter 1, for which reason this digital value corresponding to the off-set voltage is held in the off-set compensating register 8 as an off-set compensating code for compensating the off-set voltage generated by the A/D converter 1. In the initial state of the A/D conversion operations, the off-set compensating code for compensating the off-set voltage generated by the A/D converter 1 is set in the off-set compensating register 8 for subsequent fetching the off-set compensating code before substantive A/D conversion.

Subsequently, the substantive A/D conversion will be made as follows. The digital output signal 12 output in response to the input of the analog input signal, 11 is then inputted into the subtracter 2 being under the control of the control signal 24, whilst the subtracter 2 is operated to fetch the off-set compensating code 25 from the off-set compensating register 8 for subsequent subtraction of the off-set compensating code 25 from the digital output signal 12, whereby the digital output signal 26 is obtained by subtracting the off-set compensating code 25 from the digital output signal 12 before the digital output signal 26 is then outputted from the subtracter 2.

The above conventional A/D converter circuit has the following disadvantages. As described above, the above conventional A/D converter circuit executes the subtraction operation only with the off-set compensating code corresponding to the off-set voltage generated by the A/D converter, for which reason the above conventional A/D converter is capable of compensation to the off-set voltage of the A/D-converted digital signal outputted from the A/D converter 1. Notwithstanding, the above conventional A/D converter is incapable of compensations to integral linearity error and to gain error in the A/D converter 1.

In the above circumstances, it had been required to develop a novel A/D converter circuit capable of not only compensating the off-set voltage of the A/D-converted digital signal outputted from the A/D converter but also compensating both integral linearity error and gain error in the A/D converter.

SUMMARY OF THE INVENTION

Accordingly, it is an object of the present invention to provide a novel A/D converter circuit free from the above problems.

It is a further object of the present invention to provide a novel A/D converter circuit capable of not only compensating the off-set voltage of the A/D-converted digital signal outputted from the A/D converter but also compensating both integral linearity error and gain error in the A/D converter.

The present invention provides an analog-to-digital converter circuit comprising the following elements. An analog-to-digital converter is provided for converting analog signals to digital signals. A memory is provided which is connected to the analog-to-digital converter for receiving at least a part of the digital signals from the analog-to-digital converter to designate at least an address in accordance with the at least part of the digital signals, so that the memory is operated both to store compensating code data at the designated address in a compensation code capturing mode and to read out the compensating code data in an analog-to-digital conversion real operation mode. A control circuit is provided which is connected to the memory for controlling operations of the memory to switch between the compensation code capturing mode and the analog-to-digital conversion real operation mode.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
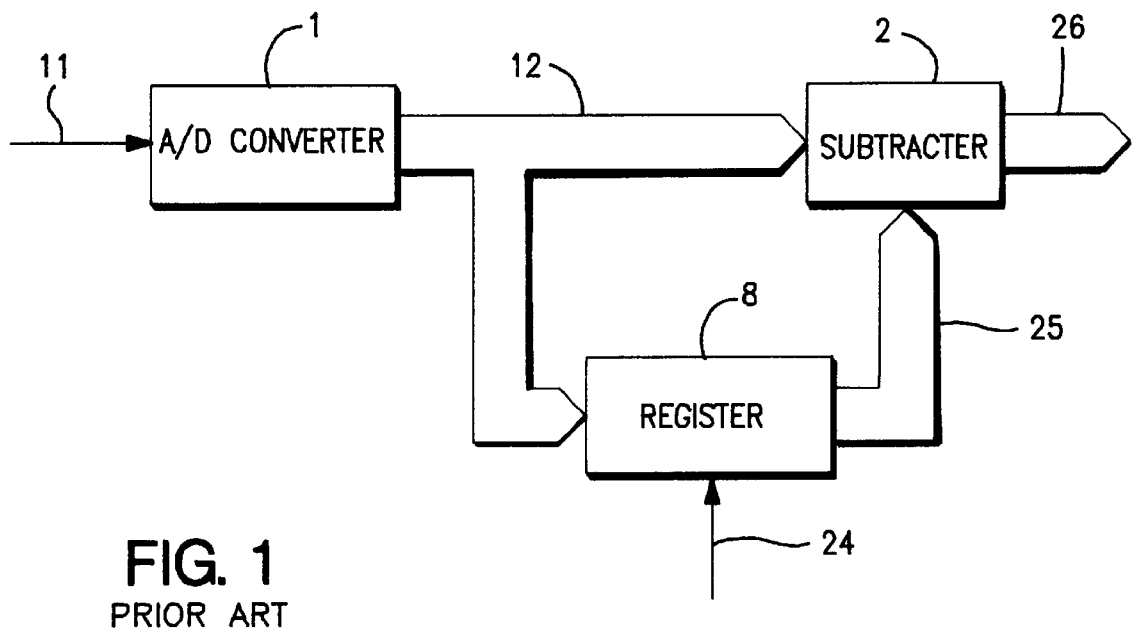
FIG. 1 is a block diagram illustrative of the conventional A/D converter circuit capable of compensating off-set voltage generated by the A/D converter.

The first present invention provides an analog-to-digital converter circuit comprising the following elements. An analog-to-digital converter is provided for converting analog signals to digital signals. A memory is provided which is connected to the analog-to-digital converter for receiving at least a part of the digital signals from the analog-to-digital converter to designate at least an address in accordance with the at least part of the digital signals, so that the memory is operated both to store compensating code data at the at least designated address in a compensation code capturing mode and to read out the compensating code data in an analog-to-digital conversion real operation mode. A control circuit is provided which is connected to the memory for controlling operations of the memory to switch between the compensation code capturing mode and the analog-to-digital conversion real operation mode.

It is preferable that the memory is operated in the compensation code capturing mode to store the compensating code data, which correspond to the digital signals from the analog-to-digital converter, into the memory at addresses designated by the digital signals, and the memory is also operated in the analog-to-digital conversion real operation mode to read out the stored compensating code data from the address so as to output the compensating code data as digital output signals of the analog-to-digital converter circuit.

It is also preferable to further comprise the following elements. A first selector is provided which is connected to the memory for receiving the compensating code data and an ideal compensating code supplied externally so that the first selector is operated to select the compensating code data in the analog-to-digital conversion real operation mode and also select the ideal compensating code in the compensation code capturing mode. A subtracter is provided which is connected to the analog-to-digital converter for receiving the digital signals from the analog-to-digital converter and also connected to the first selector for receiving the compensating code data in the analog-to-digital conversion real operation mode and also receiving the ideal compensating code in the compensation code capturing mode, so that the subtracter is operated to subtract the compensating code data from a significant signal of the digital signals in the analog-to-digital conversion real operation mode and also operated to subtract the ideal compensating code from a significant signal of the digital signals in the compensation code capturing mode.

It is also preferable to furthermore comprise a second selector connected to the subtracter for receiving a first subtracted output signal from the subtracter in the analog-to-digital conversion real operation mode and also receiving a second subtracted output signal from the subtracter in the compensation code capturing mode, so that the second selector is operated to output the first subtracted output signal as a digital output signal of the analog-to-digital converter circuit in the analog-to-digital conversion real operation mode and also operated to transmit the second subtracted output signal as the compensating code data into the memory.

It is also preferable that the control circuit is operated in the compensation code capturing mode to input a write enable signal to the memory, and also operated in the analog-to-digital conversion real operation mode to input a read enable signal into the memory.

The second present invention provides an analog-to-digital converter circuit comprising the following elements. An analog-to-digital converter is provided for converting analog signals to digital signals. A memory is provided which is connected to the analog-to-digital converter for receiving at least a part of the digital signals from the analog-to-digital converter to designate at least an address in accordance with the at least part of the digital signals, so that the memory is operated both to store compensating code data at the at least designated address in a compensation code capturing mode and to read out the compensating code data in an analog-to-digital conversion real operation mode. A control circuit is provided which is connected to the memory for controlling operations of the memory to switch between the compensation code capturing mode and the analog-to-digital conversion real operation mode. The memory is operated in the compensation code capturing mode to store the compensating code data, which correspond to the digital signals from the analog-to-digital converter, into the memory at addresses designated by the digital signals, and the memory is also operated in the analog-to-digital conversion real operation mode to read out the stored compensating code data from the address so as to output the compensating code data as digital output signals of the analog-to-digital converter circuit.

It is preferable that the control circuit is operated in the compensation code capturing mode to input a write enable signal to the memory, and also operated in the analog-to-digital conversion real operation mode to input a read enable signal into the memory.

The third present invention provides an analog-to-digital converter circuit comprising the following elements. An analog-to-digital converter is provided for converting analog signals to digital signals. A memory is provided which is connected to the analog-to-digital converter for receiving at least a part of the digital signals from the analog-to-digital converter to designate at least an address in accordance with the at least part of the digital signals, so that the memory is operated both to store compensating code data at the at least designated address in a compensation code capturing mode and to read out the compensating code data in an analog-to-digital conversion real operation mode. A control circuit is provided which is connected to the memory for controlling operations of the memory to switch between the compensation code capturing mode and the analog-to-digital conversion real operation mode. A first selector is provided which is connected to the memory for receiving the compensating code data and an ideal compensating code supplied externally so that the first selector is operated to select the compensating code data in the analog-to-digital conversion real operation mode and also select the ideal compensating code in the compensation code capturing mode. A subtracter is provided which is connected to the analog-to-digital converter for receiving the digital signals from the analog-to-digital converter and also connected to the first selector for receiving the compensating code data in the analog-to-digital conversion real operation mode and also receiving the ideal compensating code in the compensation code capturing mode, so that the subtracter is operated to subtract the compensating code data from a significant signal of the digital signals in the analog-to-digital conversion real operation mode and also operated to subtract the ideal compensating code from a significant signal of the digital signals in the compensation code capturing mode. A second selector is provided which is connected to the subtracter for receiving a first subtracted output signal from the subtracter in the analog-to-digital conversion real operation mode and also receiving a second subtracted output signal from the subtracter in the compensation code capturing mode, so that the second selector is operated to output the first subtracted output signal as a digital output signal of the analog-to-digital converter circuit in the analog-to-digital conversion real operation mode and also operated to transmit the second subtracted output signal as the compensating code data into the memory.

It is preferable that the control circuit is operated in the compensation code capturing mode to input a write enable signal to the memory, and also operated in the analog-to-digital conversion real operation mode to input a read enable signal into the memory.

PREFERRED EMBODIMENTS

First Embodiment

Figure 2:
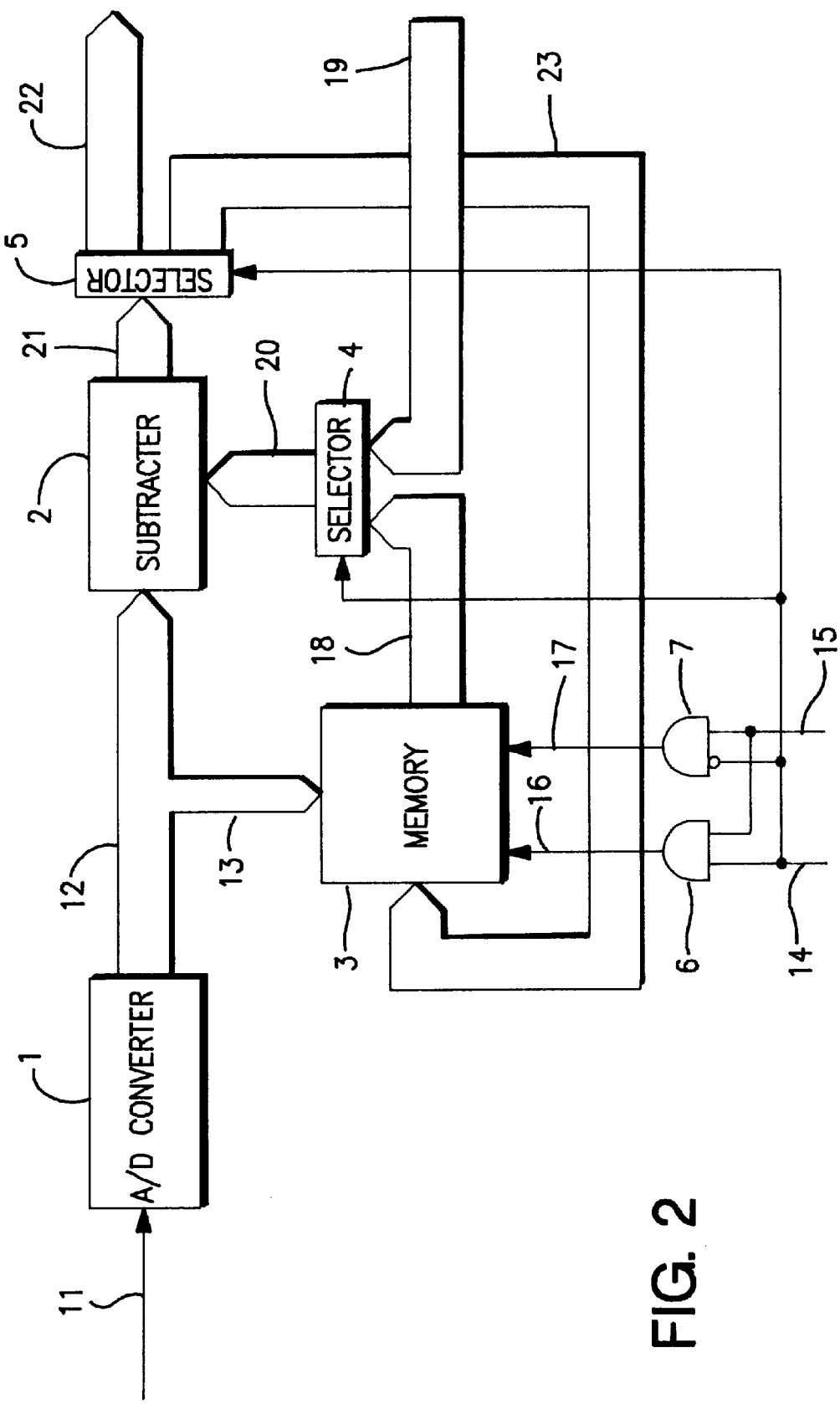
FIG. 2 is a block diagram illustrative of a first novel A/D converter circuit capable of not only compensating an off-set voltage of an A/D-converted digital signal outputted from an A/D converter but also compensating both integral linearity error and gain error in the A/D converter in a first embodiment in accordance with the present invention.

A first embodiment according to the present invention will be described in detail with reference to FIG. 2 which is a block diagram illustrative of a first novel A/D converter circuit capable of not only compensating an off-set voltage of an A/D-converted digital signal outputted from an A/D converter but also compensating both integral linearity error and gain error in the A/D converter in a first embodiment in accordance with the present invention.

The first novel A/D converter circuit comprises an A/D converter 1, a subtracter 2, first and second selectors 4 and 5, a compensating memory 3, and first and second AND-gates 6 and 7. The A/D converter 1 receives an analog input signal for subsequent A/D conversion to generate an A/D-converted output signal 12. The subtracter 2 is connected to the A/D converter 1 for receiving the A/D-converted output signal 12 from the A/D converter 1. The subtracter 2 is also connected to the first selector 4 for receiving a subtracter input signal 20 from the first selector 4. The first selector 4 receives a control signal 14 so that the first selector 4 is operated under the control of the control signal 14. The subtracter 2 having received both the A/D-converted output signal 12 and the subtracter input signal 20 is operated to subtract the subtracter input signal 20 from the A/D-converted output signal 12, thereby generating a subtracter output signal 21. The second selector 5 is connected to the subtracter 2 for receiving the subtracter output signal 21 from the subtracter 2 to select any one of a digital output signal 22 and a compensating code input signal 23. The second selector 5 receives the control signal 14 so that the second selector 5 is operated under the control of the control signal 14. The first AND gate 6 has two input terminals for receiving the control signal 14 and an A/D conversion terminating signal 15 for subsequent AND-operation of the control signal 14 and the A/D conversion terminating signal 15 to generate a write enable signal 16. The second AND gate 7 has two input terminals for receiving a signal inverted from the control signal 14 and the A/D conversion terminating signal 15 for subsequent AND-operation of the inverted control signal 14 and the A/D conversion terminating signal 15 to generate a read enable signal 17. The compensation memory 3 is connected to the first AND gate 6 for receiving the write enable signal 16 from the first AND gate 6. The compensation memory 3 is also connected to the second AND gate 7 for receiving the read enable signal 17 from the second AND gate 7. The compensation memory 3 is also connected to the second selector 5 for receiving the compensating code input signal 23 from the second selector 5. The compensation memory 3 is also connected to the A/D converter 1 for receiving a significant bit signal 13 including the most significant bit from the A/D converter 1. The compensation memory 3 has a bit width which corresponds to a resolution of the A/D converter 1. If the write enable signal 16 is high level or "1" whilst the read enable signal 17 is low level or "0", then the compensation memory 3 shows the write operation to store the compensating code input signal 23 at an address designated by the significant bit signal 13 including the most significant bit. If the write enable signal 16 is low level or "0" whilst the read enable signal 17 is high level or "1", then the compensation memory 3 shows the read operation to output, as a compensating code output signal 18, the compensating code data stored at the address designated by the significant bit signal 13 including the most significant bit, so that the compensating code output signal 18 is transmitted to the first selector 4. The first selector 4 receives both the compensating code output signal 18 from the compensation memory 3 and an ideal code 19 to select any one of the compensating code output signal 18 and the ideal code 19 under the control of the control signal 14 to generates the subtracter input signal 20 to be inputted into the subtracter 2. The subtracter 2 having received both the A/D-converted output signal 12 and the subtracter input signal 20 is operated to subtract the subtracter input signal 20 from the A/D-converted output signal 12, thereby generating the subtracter output signal 21 to be inputted into the second selector 5, before the subtracter 2 is operated under the control of the control signal 14 to select any one of the digital output signal 22 and the compensating code input signal 23.

The above first novel A/D converter circuit shows the following two operational modes. The first operational mode is a compensating code capturing mode. The second operational mode is an A/D conversion real operation mode. The operations of the above first novel A/D converter circuit are switched by the control signal 14 between the compensating code capturing mode and the A/D conversion real operation mode. The resolution of the A/D converter 1 is 8-bits to provide the compensating memory 3 with eight addresses "0H", "1H", "2H", "3H", "4H", "5H", "6H" and "7H". The significant bit signal 13 of the A/D converter output signal 12 comprises the most significant, second most significant and third most significant bits of the A/D converter output signal 12. The compensating code storing addresses of the compensating memory 3 are set as following in accordance with the A/D converter output signal 12. If the significant bits of the A/D converter output signal 12 comprise "00H" to "1FH", then the compensating code is stored in the address. "0H" of the compensating memory 3. If the significant bits of the A/D converter output signal 12 comprise "20H" to "3FH", then the compensating code is stored in the address "1H" of the compensating memory 3. If the significant bits of the A/D converter output signal 12 comprise "40H" to "5FH", then the compensating code is stored in the address "2H" of the compensating memory 3. If the significant bits of the A/D converter output signal 12 comprise "60H" to "7FH", then the compensating code is stored in the address "3H" of the compensating memory 3. If the significant bits of the A/D converter output signal 12 comprise "80H" to "9FH", then the compensating code is stored in the address "4H" of the compensating memory 3. If the significant bits of the A/D converter output signal 12 comprise "A0H" to "BFH", then the compensating code is stored in the address "5H" of the compensating memory 3. If the significant bits of the A/D converter output signal 12 comprise "C0H" to "DFH", then the compensating code is stored in the address "6H" of the compensating memory 3. If the significant bits of the A/D converter output signal 12 comprise "E0H" to "FFH", then the compensating code is stored in the address "7H" of the compensating memory 3.

The following descriptions will focus on the operations of the above first novel A/D converter circuit in the first operational mode, for example, in the compensating code capturing mode. The control signal 14 is set to be the high level "1". This control signal 14 is inputted into the first and second AND gates 6 and 7 as well as inputted into the first and second selectors 4 and 5. In accordance with the control signal 14 of the high level "1", the first selector 4 is operated to select the ideal code 19 externally inputted for outputting the selected ideal code 19 as the subtraction input signal 20 to be inputted into the subtraction 2. In accordance with the control signal 14 of the high level "1", the second selector 5 having received the subtracter output signal 21 is operated to output the compensating code input signal 23 which is to be inputted into the compensating memory 3. At the same time when the A/D conversion operation by the A/D converter 1 has been finished, the A/D conversion termination signal 15 comes the high level "1" to be inputted into the first and second AND gates 6 and 7. The first AND gate 6 implements the AND operation of the A/D conversion termination signal 15 and the control signal 14 thereby to output the write enable signal 16 after the subtraction operation by the subtracter 2 has been defined. The write enable signal 16 outputted from the first AND gate 6 is then inputted into the compensating memory 3. Only if both the A/D conversion termination signal 15 and the control signal 14 are the high level "1", then the write enable signal 16 of the high level "1" is inputted into the compensating memory 3.

In order to store the compensating code at the address "0H" of the compensating memory 3, the analog input signal 11 to be inputted into the A/D converter 1 is so set that the A/D converter 1 outputs the A/D converter output signal 12 including the significant bits of "00H" to "1FH" and concurrently the ideal code 19 corresponding to the set analog input signal 11 is also inputted into the selector 4 for subsequently permitting the A/D converter 1 to start the A/D conversion operation of: the set analog signal 11. After the A/D conversion operation by the A/D converter 1 has been finished, then the ideal code 19 selected by the first selector 4 is inputted as the subtracter input signal 20 into the subtracter 2, so that the subtracter 2 implements the subtraction operation to subtract the ideal code 19 from the A/D converter output signal 12 for subsequent output of the subtracter output signal 21 as a result of the subtraction operation. The subtracter output signal 21 is then inputted into the second selector 5 which is operated under the control of the control signal 14 of the high level "1" to output the compensating code input signal 23. The outputted compensating code input signal 23 is then inputted into the compensating memory 3 upon the input of the write enable signal 16 into the compensating memory 3. At the same time when the A/D conversion operation by the A/D converter 1 has been finished, then the A/D conversion termination signal 15 comes the high level "1" to be inputted into the first AND gate 6, whereby the first AND gate 6 outputs the write enable signal 16 of the high level "1" to be inputted into the compensating memory 3. The compensating code input signal 23 is written into the address "0H" of the compensating memory 3 upon input of the write enable signal 16 of the high level "1" into the compensating memory 3.

This process is repeated to store the compensating code at each of the address "1H" "7H" of the compensating memory 3, by setting the analog input signal 11 to be inputted into the A/D converter 1 set that the A/D converter 1 outputs the A/D converter output signal 12 including the appropriate significant bits note above.

Subsequently, the operations in the A/D conversion real operation mode will be described. The control signal 14 is set to be the low level "0". This control signal 14 is inputted into the first and second AND gates 6 and 7 as well as inputted into the first and second selectors 4 and 5. In accordance with the control signal 14 of the low level "0", the first selector 4 is operated to select the compensating code output signal 18 transmitted from the compensating memory 3 for outputting the selected compensating code output signal 18 as the subtraction in put signal 20 to be inputted into the subtraction 2. In accordance with the control signal 14 of the low level "0", the second selector 5 having received the subtracter output signal 21 is operated to output the digital output signal 22. At the same time when the A/D conversion operation by the A/D converter 1 has been finished, the A/D conversion termination signal 15 comes the high level "1" to be inputted into the first and second AND gates 6 and 7. The second AND gate 7 implements the AND operation of the A/D conversion termination signal 15 and the inverted control signal 14 thereby to output the read enable signal 17 after the subtraction operation by the subtracter 2 has been defined. The read enable signal 17 outputted from the second AND gate 7 is then inputted into the compensating memory 3. Only if the A/D conversion termination signal 15 is the high level "1" whilst the control signal 14 is the low level "0", then the read enable signal 17 of the high level "1" is inputted into the compensating memory 3.

As described above, the A/D conversion real operation mode is set upon input of the control signal 14 of the low level "0". In this A/D conversion real operation mode, the analog input signal 11 is inputted into the A/D converter 1 for the A/D conversion operation to generate the A/D converter output signal 12. At the same time when the A/D conversion operation by the A/D converter 1 has been finished, the A/D conversion termination signal 15 comes the high level "1" to be inputted into the first and second AND gates 6 and 7. The second AND gate 7 outputs the read enable signal 17 of the high level "1" which is to be inputted into the compensating memory 3 upon input of the A/D conversion termination signal 15 of the high level "1" into the compensating memory 3, whereby the compensating code data stored at the address corresponding to the significant bit signal 13 of the A/D converter output signal 12 are read out as the compensating code output signal 18 which is to be inputted into the first selector 4. The first selector 4 under the control of the low level control signal "0" is operated to select the compensating code output signal 18 to output the compensating code output signal 18 as the subtracter input signal 20 to be inputted into the subtracter 2. The subtracter 2 is then operated to subtract the compensating code output signal 18 as the subtracter input signal 20 from the A/D converter output signal 12 for outputting the subtracter output signal 21 which is to be inputted into the second selector 5. The second selector under the control of the low level control signal "0" is operated to output the digital output signal 22.

As described above, the first novel A/D converter circuit is so operated that the compensating code corresponding to the analog input signal remains stored in the compensating memory at the address designated by the A/D converted digital value corresponding to the analog input signal until the operations of the first novel A/D converter circuit enters into the A/D conversion real operation mode by the control signal for reading out the stored compensating code data from the above address in order to compensate, with the compensating code, errors of the A/D converter output signal outputted from the A/D converter, whereby both the error caused by the off-set voltage of the A/D converter and the errors of the digital output signal including the integral linearity error and the gain error are compensated.

As a modification to the above first embodiment, it is possible to change the bit width of the significant bit signal 13 of the A/D converter output signal 12 for changing the range of the A/D converted digital values for one compensated value. If, for example, the bit width of the significant bit signal 13 of the 8-bits resolution A/D converter output signal 12 is set to be the 8-bits, then the compensating codes are set for all of the codes of the A/D converter output signal 12 in order to realize the most accurate A/D conversion.

As a further modification to the above first embodiment, it is possible to reduce the bit width of the compensating code for minimization of the memory capacity of the compensating memory 3. If, for example, the A/D conversion error of the A/D converter 1 is within only 1%, then all of the most significant to sixth most significant bits are "0", whereby no compensating code is needed. This means it possible to reduce the capacity of the compensating memory 3.

Consequently, in accordance with the first embodiment, the first novel A/D converter circuit is so operated that the compensating code corresponding to the analog input signal at any level of from "0" level to "FULL" level is stored in the compensating memory at the address designated by the A/D converted digital value corresponding to the analog input signal so that, in the subsequent operations in the A/D conversion real operation mode, the stored compensating code data are read out from the above address in order to subtract the compensating code from the A/D converted digital value corresponding to the analog input signal, whereby not only the error caused by the off-set voltage of the A/D converter but also the errors of the digital output signal including the integral linearity error and the gain error are compensated.

Second Embodiment

Figure 3:
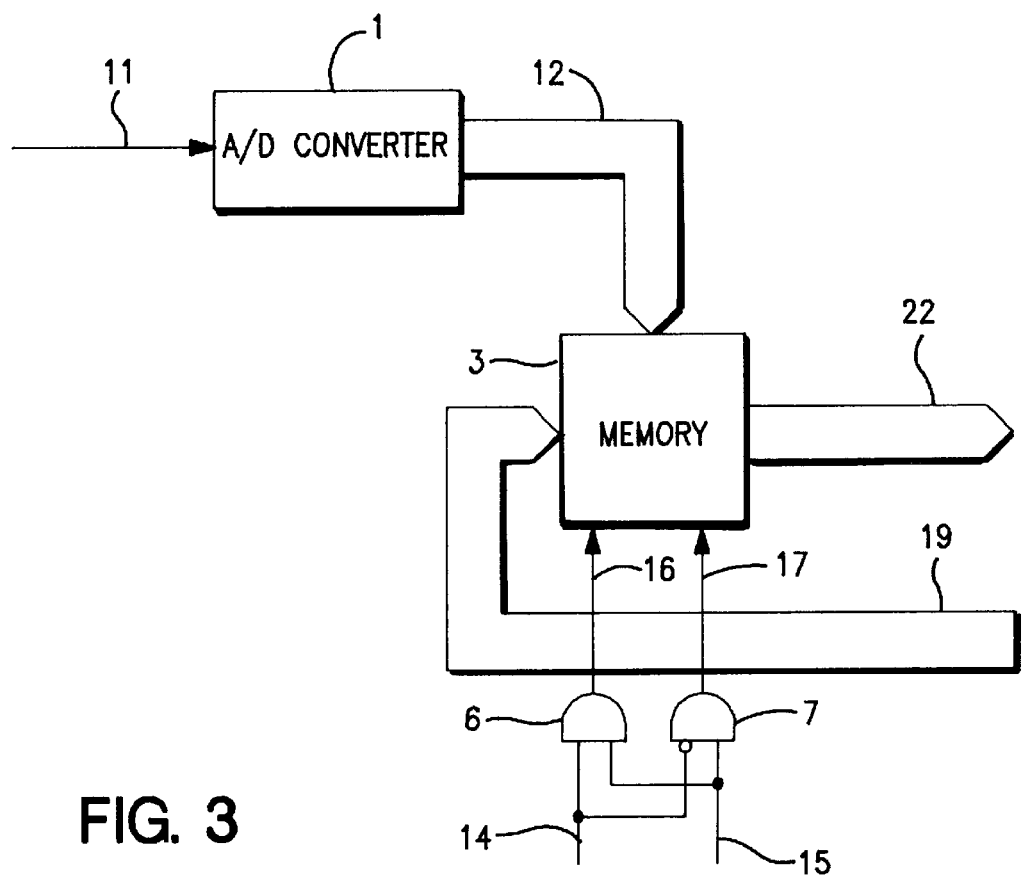
FIG. 3 is a block diagram illustrative of a second novel A/D converter circuit capable of not only compensating an off-set voltage of an A/D-converted digital signal outputted from an A/D converter but also compensating both integral linearity error and gain error in the A/D converter in a second embodiment in accordance with the present invention.

A second embodiment according to the present invention will be described in detail with reference to FIG. 3 which is a block diagram illustrative of a second novel A/D converter circuit capable of not only compensating an off-set voltage of an A/D-converted digital signal outputted from an A/D converter but also compensating both integral linearity error and gain error in the A/D converter in a second embodiment in accordance with the present invention.

The second novel A/D converter circuit comprises an A/D converter 1, a compensating memory 3, and first and second AND-gates 6 and 7. The A/D converter 1 receives an analog input signal for subsequent A/D conversion to generate an A/D-converted output signal 12. The first AND gate 6 has two input terminals for receiving the control signal 14 and an A/D conversion terminating signal 15 for subsequent AND-operation of the control signal 14 and the A/D conversion terminating signal 15 to generate a write enable signal 16. The second AND gate 7 has two input terminals for receiving a signal inverted from the control signal 14 and the A/D conversion terminating signal 15 for subsequent AND-operation of the inverted control signal 14 and the A/D conversion terminating signal 15 to generate a read enable signal 17. The compensation memory 3 is connected to the first AND gate 6 for receiving the write enable signal 16 from the first AND gate 6. The compensation memory 3 is also connected to the second AND gate 7 for receiving the read enable signal 17 from the second AND gate 7. The compensation memory 3 is also connected to the A/D converter 1 for receiving the A/D converter output signal 12 from the A/D converter 1. The compensation memory 3 has a bit width which corresponds to a resolution of the A/D converter 1. An ideal code 19 is externally inputted into the compensation memory 3. If the write enable signal 16 is high level or "1" whilst the read enable signal 17 is low level or "0", then the compensation memory 3 shows the write operation to store the ideal code 19 at an address designated by the A/D converter output signal 12. If the write enable signal 16 is low level or "0" whilst the read enable signal 17 is high level or "1", then the compensation memory 3 shows the read operation to output, as a digital output signal 22, the ideal code 19 stored at the address designated by the A/D converter output signal 12.

The above second novel A/D converter circuit shows the following two operational modes. The first operational mode is a compensating code capturing mode. The second operational mode is an A/D conversion real operation mode. The operations of the above second novel A/D converter circuit are switched by the control signal 14 between the compensating code capturing mode and the A/D conversion real operation mode. The resolution of the A/D converter 1 is 8-bits to provide the compensating memory 3 with 256 addresses of "00H" to "FFH". The bit width comprises 8-bits in correspondence with the resolution of the A/D converter 1. Upon input of the write enable signal 16 of the high level "1" into the compensating memory 3, the ideal codes 19 corresponding to the A/D converter output signal 12 are written into the 256 addresses of "00H" to "FFH".

Subsequently, the operations in the A/D conversion real operation mode will be described. The control signal 14 is set to be the low level "0". This control signal 14 is inputted into the first and second AND gates 6 and 7. At the same time when the A/D conversion operation by the A/D converter 1 has been finished, the A/D conversion termination signal 15 comes the high level "1" to be inputted into the first and second AND gates 6 and 7. Only if both the A/D conversion termination signal 15 is the high level "1" whilst the control signal 14 is the low level "0", then the read enable signal 17 of the high level "1" is inputted into the compensating memory 3.

As described above, the A/D conversion real operation mode is set upon input of the control signal 14 of the low level "0". In this A/D conversion real operation mode, the analog input signal 11 is inputted into the A/D converter 1 for the A/D conversion operation to generate the A/D converter output signal 12. At the same time when the A/D conversion operation by the A/D converter 1 has been finished, the A/D conversion termination signal 15 comes the high level "1" to be inputted into the first and second AND gates 6 and 7. The second AND gate 7 outputs the read enable signal 17 of the high level "1" which is to be inputted into the compensating memory 3 upon input of the A/D conversion termination signal 15 of the high level "1" into the compensating memory 3, whereby the ideal code data stored at the addresses corresponding to the A/D converter output signal 12 are read out as the digital output signal 22.

As described above, the ideal codes are set for the addresses corresponding to the A/D converter output signal 12, so that no subtracter nor select is thus needed, resulting in a scaling down of the A/D converter circuit.

Consequently, the second novel A/D converter circuit is so operated that the ideal codes corresponding to the analog input signal is stored in the compensating memory at the addresses designated by the A/D converted digital values corresponding to the analog input signals so that, in the A/D conversion real operation mode, whereby not only the error caused by the off-set voltage of the A/D converter but also the errors of the digital output signal including the integral linearity error and the gain error are compensated.

Whereas modifications of the present invention will be apparent to a person having ordinary skill in the art, to which the invention pertains, it is to be understood that embodiments as shown and described by way of illustrations are by no means intended to be considered in a limiting sense Accordingly, it is to be intended to cover by claims all modifications which fall within the spirit and scope of the present invention.

What is claimed is:

1. An analog-to-digital converter circuit comprising:

an analog-to-digital converter for converting analog signals to digital signals;

a memory connected to said analog-to-digital converter for receiving at least a part of said digital signals from said analog-to-digital converter to designate at least an address in accordance with said at least part of said digital signals, said memory storing compensating code data at said at least designated address in a compensation code capturing mode and reading out said compensating code data in an analog-to-digital conversion real operation mode;

a control circuit connected to said memory for switching said memory between said compensation code capturing mode and said analog-to-digital conversion real operation mode;

a first selector connected to said memory for receiving said compensating code data and an ideal compensating code supplied externally so that said first selector selects said compensating code data in said analog-to-digital conversion real operation mode and selects said ideal compensating code in said compensation code capturing mode;

a subtracter connected to said analog-to-digital converter for receiving said digital signals from said analog-to-digital converter and also connected to said first selector for receiving said compensating code data in said analog-to-digital conversion real operation mode and receiving said ideal compensating code in said compensation code capturing mode, so that said subtracter subtracts said compensating code data from a significant signal of said digital signals in said analog-to-digital conversion real operation mode and subtracts said ideal compensating code from a significant signal of said digital signals in said compensation code capturing mode;

a second selector connected to said subtracter for receiving a first subtracted output signal from said subtracter in said analog-to-digital conversion real operation mode and receiving a second subtracted output signal from said subtracter in said compensation code capturing mode, so that said second selector outputs said first subtracted output signal as a digital output signal of said analog-to-digital converter circuit in said analog-to-digital conversion real operation mode and outputs said second subtracted output signal as said compensating code data to said memory;

said control circuit comprising, a first logical gate having as inputs mode selector signals indicating which of the two modes is selected and analog-to-digital conversion termination signals indicating terminations of analog-to-digital conversion of each of said at least part of said digital signals, said first logical gate having its output connected to said memory to provide a write enable signal to said memory when the compensation code capturing mode is selected and when the analog-to-digital conversion termination signals indicate that analog-to-digital conversion has terminated;

a second logical gate having as inputs an inversion of the mode selector signals and the analog-to-digital conversion termination signals, said second logical gate having its output connected to said memory to provide a read enable signal to said memory when the analog-to-digital conversion real operation mode is selected and when the analog-to-digital conversion termination signals indicate that analog-to-digital conversion has terminated; and said first and second selectors being connected to and controlled by said mode selector signals.

* * * * *